United States Patent
Wang et al.

(10) Patent No.: US 9,947,730 B2
(45) Date of Patent: Apr. 17, 2018

(54) FLEXIBLE DISPLAY DEVICE AND METHOD FOR PACKAGING THE SAME

(71) Applicant: BOE TECHNOLOGY GROUP CO., LTD., Beijing (CN)

(72) Inventors: Tao Wang, Beijing (CN); Tao Sun, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/913,873

(22) PCT Filed: Aug. 12, 2015

(86) PCT No.: PCT/CN2015/086758
§ 371 (c)(1),
(2) Date: Feb. 23, 2016

(87) PCT Pub. No.: WO2016/161735
PCT Pub. Date: Oct. 13, 2016

(65) Prior Publication Data
US 2017/0040392 A1      Feb. 9, 2017

(30) Foreign Application Priority Data
Apr. 9, 2015   (CN) .......................... 2015 1 0166496

(51) Int. Cl.
*H01L 27/32* (2006.01)
*H01L 23/00* (2006.01)
*H01L 51/52* (2006.01)

(52) U.S. Cl.
CPC ........ *H01L 27/3246* (2013.01); *H01L 23/564* (2013.01); *H01L 51/5253* (2013.01); *H01L 2251/5338* (2013.01)

(58) Field of Classification Search
CPC ............... H01L 23/564; H01L 27/3246; H01L 51/5253
See application file for complete search history.

(56) References Cited

U.S. PATENT DOCUMENTS

2004/0145310 A1   7/2004  Su et al.
2007/0159094 A1   7/2007  Oh et al.
(Continued)

FOREIGN PATENT DOCUMENTS

CN      103137654 A     6/2013
CN      103474580 A    12/2013
(Continued)

OTHER PUBLICATIONS

First Office Action regarding Chinese Application No. 201510166496.4, dated Mar. 24, 2017. Translation provided by Dragon Intellectual Property Law Firm.
(Continued)

*Primary Examiner* — Allan R Wilson
(74) *Attorney, Agent, or Firm* — Harness, Dickey & Pierce, P.L.C.

(57) ABSTRACT

The present disclosure provides a flexible display device and a method for packaging the same. The flexible display device includes a light-emitting component and a packaging layer for packaging the light-emitting component. The packaging layer includes a patterned first film layer with patterned gaps, and a second film layer at least covering the patterned gaps in the first film layer.

20 Claims, 6 Drawing Sheets

(56) References Cited

U.S. PATENT DOCUMENTS

| | | | |
|---|---|---|---|
| 2010/0200846 A1* | 8/2010 | Kwack | H01L 51/5253 257/40 |
| 2012/0049235 A1* | 3/2012 | Mo | H01L 51/524 257/99 |
| 2012/0168808 A1* | 7/2012 | Lin | H01L 51/5246 257/99 |
| 2014/0152174 A1 | 6/2014 | Wang et al. | |
| 2015/0034934 A1* | 2/2015 | Rohatgi | H01L 51/524 257/40 |
| 2015/0042346 A1 | 2/2015 | Oh et al. | |
| 2015/0129842 A1* | 5/2015 | Han | H01L 27/3248 257/40 |
| 2015/0188082 A1* | 7/2015 | Rohatgi | H01L 51/5253 257/40 |
| 2015/0364718 A1 | 12/2015 | Huang et al. | |
| 2015/0372256 A1* | 12/2015 | Jiao | H01L 51/5259 257/40 |
| 2016/0043347 A1 | 2/2016 | Sun | |
| 2016/0254489 A1 | 9/2016 | Sun et al. | |
| 2017/0012237 A1 | 1/2017 | Sun et al. | |

FOREIGN PATENT DOCUMENTS

| | | |
|---|---|---|
| CN | 103715366 A | 4/2014 |
| CN | 103943788 A | 7/2014 |
| CN | 104269426 A | 1/2015 |
| CN | 104733507 A | 6/2015 |

OTHER PUBLICATIONS

International Search Report and Written Opinion of the International Searching Authority for International Application No. PCT/CN2015/086758, dated Jan. 11, 2016. Translation provided by Dragon Intellectual Property Law Firm.

Second Chinese Office Action regarding Application No. 201510166496.4 dated Oct. 20, 2017.

* cited by examiner

FLEXIBLE DISPLAY DEVICE AND METHOD FOR PACKAGING THE SAME

CROSS-REFERENCE TO RELATED APPLICATION

This application is the U.S. national phase of PCT Application No. PCT/CN2015/086758 filed on Aug. 12, 2015, which claims priority to Chinese Patent Application No. 201510166496.4 filed on Apr. 9, 2015, the disclosures of which are incorporated in their entirety by reference herein.

TECHNICAL FIELD

The present disclosure relates to the field of display, and in particular to a flexible display device and a method for packaging the same.

BACKGROUND

The flexible displayer is light and thin, flexible and impact-resistant, which will replace the conventional flat-panel displayer to become a mainstream displayer. In the display technology in the related art by which a flexible display can be realized, the organic light emitting display (OLED) is becoming a research hotspot of the flexible display area recently because the OLED has the advantages of fast response, wide view angle, high brightness, low power consumption and so on and the OLED is a self light-emitting component and bending-resistant.

The OLED is sensitive to moisture and oxygen, which is prone to attenuation, and an effective packaging may block the moisture and oxygen, prevent an aging of organic materials and prolong a service life of the OLED. At present, an OLED apparatus is generally covered completely by depositing one or more layers of film on a substrate so as to realize a packaging of the OLED apparatus. Although the OLED apparatus has a good moisture and oxygen blocking performance to guarantee the service life thereof, a flexible OLED apparatus may be bended, crimped or folded, so the film for packaging the OLED apparatus may be broken. That is, it is not reliable to package a flexible apparatus by the film in the related art.

SUMMARY

Embodiments of the present disclosure provide a flexible display device and a method for packaging the same, which can solve the problem in the related art that the film packaging is not resistant to bending.

In order to achieve the above object, the technical solution provided by some embodiments of the present disclosure is described as follows.

A flexible display device is provided by some embodiments of the present disclosure, including a light-emitting component and a packaging layer for packaging the light-emitting component. The packaging layer includes a patterned first film layer with patterned gaps, and a second film layer at least covering the patterned gaps in the first film layer.

Optionally, the packaging layer is a moisture and oxygen blocking layer.

Optionally, the flexible display device further includes a pixel-defining structure defining luminescent material filling areas; there is an overlapping area of the first film layer and the second film layer, and the overlapping area corresponds to the pixel-defining structure.

Optionally, the first film layer and the second film layer are arranged above or below the light-emitting component, and edges of the first film layer and the second film layer extend outward to cover lateral sides of the light-emitting component at a very edge of the flexible display device.

Optionally, the first film layer includes a plurality of curved bar-like structures.

Optionally, the second film layer includes a plurality of curved bar-like structures, and the bar-like structures of the second film layer are complementary to the bar-like structures of the first film layer.

Optionally, the flexible display device further includes planarization layers. The planarization layers and the packaging layers are stacked alternately to package the light-emitting component of the flexible display device.

Optionally, at least one of the packaging layers is arranged between the planarization layer and the light-emitting component.

Optionally, two packaging layers arranged at two sides of the planarization layer both have bar-like patterns. The bar-like patterns of one of the two packaging layers are arranged along a first direction, and the bar-like patterns of the other one of the two packaging layers are arranged along a second direction which is not parallel to the first direction.

Optionally, the patterned gaps in a frequently-bended portion of the first film layer are arranged at a first patterned gap density, and the patterned gaps in portions of the first film layer except the frequently-bended portion of the first film layer are arranged at a second patterned gap density. The first patterned gap density is larger than the second patterned gap density.

Optionally, the first film layer and the second film layer are made of different inorganic materials.

A method for packaging a flexible display device is further provided by some embodiments of the present disclosure, including a step of forming a packaging layer. The step of forming the packaging layer includes: forming a patterned first film layer with patterned gaps; and forming a second film layer at least covering the patterned gaps in the first film layer.

Optionally, the second film layer is patterned, and the patterned first film layer or the patterned second film layer is formed by a vapor deposition method.

Optionally, there is an overlapping area of the first film layer and the second film layer. The overlapping area corresponds to the pixel-defining structure.

Optionally, the packaging layer is a moisture and oxygen blocking layer.

Optionally, the method further includes a step of forming a planarization layer. The step of forming the planarization layer and the step of forming the packaging layer are performed alternately.

Optionally, after a light-emitting component is manufactured, the packaging layer is first formed.

Optionally, the step of forming the planarization layer and the step of forming the packaging layer being performed alternately includes: forming a first packaging layer with bar-like structures which are complementary to each other; forming one planarization layer; and forming a second packaging layer with bar-like structures which are complementary to each other. The bar-like structures in the second packaging layer and the bar-like structures in the first packaging layer cross each other.

Optionally, the step of forming the planarization layer includes: depositing the planarization layer onto a display area of the flexible display device by a distillation method, or coating the planarization layer by a screen printing machine or a spraying device.

A flexible display device and a method for packaging the same are provided by some embodiments of the present disclosure, by which the packaging layer for packaging the light-emitting component is layered and patterned, so as to enable one film layer to at least cover the patterned gaps in the other patterned film layer, such that the light-emitting component may be covered completely so as to block moisture and oxygen, and a stress accumulated on the flexible display device may be reduced when the flexible display device is bended, crimped or even folded and packaging film layer may not be broken, thereby the film packaging may be made to be bend-resistant.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DRAWING REFERENCE NUMBER

10—substrate, 11—light-emitting component, 12—moisture and oxygen blocking layer, 121—first film layer, 122—second film layer, 13—planarization layer, 14—packaging film, 111—luminescent material filling area, 110—pixel-defining structure, 12a—moisture and oxygen blocking layer, 12b—moisture and oxygen blocking layer

DETAILED DESCRIPTION

Technical solutions of embodiments of the present disclosure will be described hereinafter in a clear and complete manner in conjunction with the drawing in the embodiments. Obviously, the following embodiments merely relate to a part of, rather than all of, the embodiments of the present disclosure.

Figure 1:
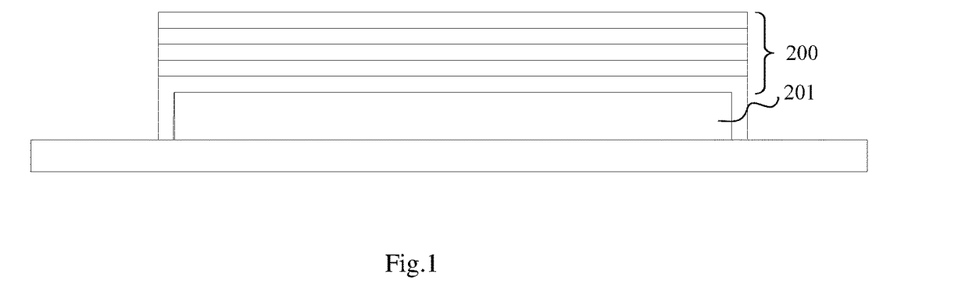
FIG. 1 is a sectional view of a flexible light-emitting device packaged by a film in the related art.

In order to block the moisture and oxygen and package the OLED apparatus effectively, as shown in FIG. 1, an OLED apparatus 201 is generally covered completely by depositing one or more layers of film 200 on a substrate. However, when the flexible display device is packaged by such method, cracks may appear on the packaging film layer when the flexible display device is bended. When the apparatus is bended, the packaging film layer may be fractured along a direction of the cracks because of holes in the packaging film layer and a stress matching between the packaging film layer and film layers touching the same.

In view of this, a flexible display device is provided by some embodiments of the present disclosure, including: a light-emitting component and a packaging layer for packaging the light-emitting component. The packaging layer includes: a patterned first film layer, and a second film layer which at least covers patterned gaps in the first film layer.

According to some embodiments of the present disclosure, the packaging layers, which are arranged in one layer in the related art, are arranged in different layers and patterned. In a word, according to some embodiments of the present disclosure, the packaging layer at least includes a patterned first film layer and a patterned or non-patterned second film layer, the second film layer at least covers the patterned gaps in the first film layer, such that the light-emitting component may be covered completely so as to block moisture and oxygen, and by the layering and patterning design, a stress accumulated on the flexible display device may be reduced when the flexible display device is bended, crimped or even folded and packaging film layer may not be broken, thereby the film packaging may be made to be bend-resistant.

Figure 2:
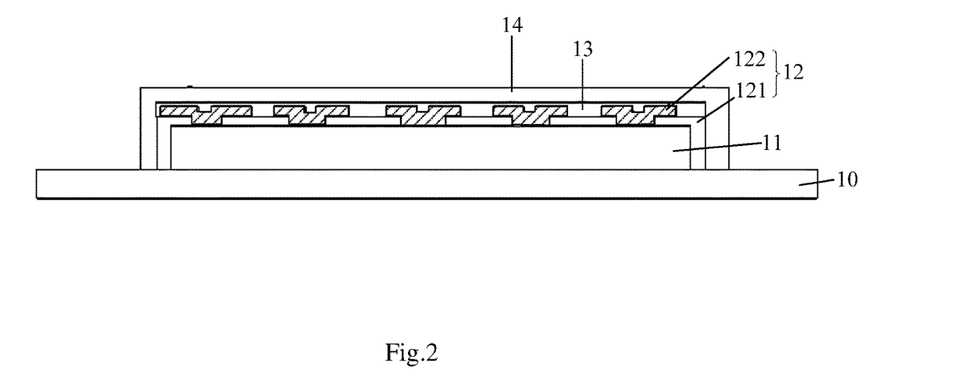
FIG. 2 is a sectional view of a flexible display device according to some embodiments of the present disclosure.

The packaging layer includes but limited to the moisture and oxygen blocking layer. The flexible display device and the structure thereof provided by some embodiments of the present disclosure will be described hereinafter in detail by taking the moisture and oxygen blocking layer for example. As shown in FIG. 2, the flexible display device includes: a substrate 10, a light-emitting component 11 arranged on the substrate 10 and a moisture and oxygen blocking layer 12 configured to package the light-emitting component 11. The moisture and oxygen blocking layer 12 includes a patterned first film layer 121, and a second film layer 122 which at least covers the patterned gaps in the first film layer 121.

The flexible display device provided by some embodiments of the present disclosure includes at least one moisture and oxygen blocking layer 12 configured to package the flexible display device. The moisture and oxygen blocking layer 12 at least includes the patterned first film layer 121 and the second film layer 122 at least covering the patterned gaps in the first film layer 121. The first and the second film layers together cover the light-emitting component 11 completely, so as to block moisture and oxygen. In addition, the first film layer 121 is patterned, by which, when the flexible display device is bended, crimped or even folded, an extending path of the stress performed on the film layer may be cut off, an extension of the cracks may be blocked, and a probability of microcracks may be reduced when the flexible display device is bended, thereby the film packaging may be made to be bend-resistant. In some embodiments of the present disclosure, in order to further improve bend-resistant performance of the flexible display device, a density of the patterned gaps in a frequently-bended portion of the first film layer 121 is larger than a density of the patterned gaps in portions of the first film layer except the frequently-bended portion of the first film layer 121. That is, the patterned gaps in the frequently-bended portion of the first film layer 121 are arranged at a first patterned gap density, and the patterned gaps in the portions of the first film layer except the frequently-bended portion of the first film layer 121 are arranged at a second patterned gap density. The first patterned gap density is larger than the second patterned gap density.

Optionally, as shown in FIG. 2, the first film layer 121 and the second film layer 122 are arranged above the light-emitting component 11 (e.g., OLED apparatus), and edges thereof extend outward, thereby a side face of the light-emitting component at a very edge of the flexible display device may be covered by the moisture and oxygen blocking layer 12, so as to prevent moisture and oxygen from entering from lateral sides. Of course, the moisture and oxygen blocking layer 12 may be arranged above the light-emitting component 11, and the edge thereof extends outward and downward to cover the light-emitting component of the flexible display device and the side faces thereof.

No matter whether the first film layer 121 and the second film layer 122 are patterned or not, they are extended beyond the display area of the flexible display device, so as to guarantee that the moisture and oxygen blocking layer 12 formed by the first and the second film layers may not only cover the light-emitting component 11 but also the lateral sides of the light-emitting component at the very edge of the display area, such that the light-emitting component 11 of the flexible display device may be covered completely, thereby blocking moisture and oxygen from entering, preventing the aging of the organic materials and prolonging the service life of the light-emitting component.

In practical implementation, a thickness of the first film layer 121 and the pattern thereof may be arranged as needed (e.g., according to the bend-resistant performance), and that is not limited herein. In addition, the second film layer may be patterned or not, as long as the patterned gaps in the first film layer 121 may be covered, so as to cover the light-emitting component 11 completely and then protect the same.

Figure 3:
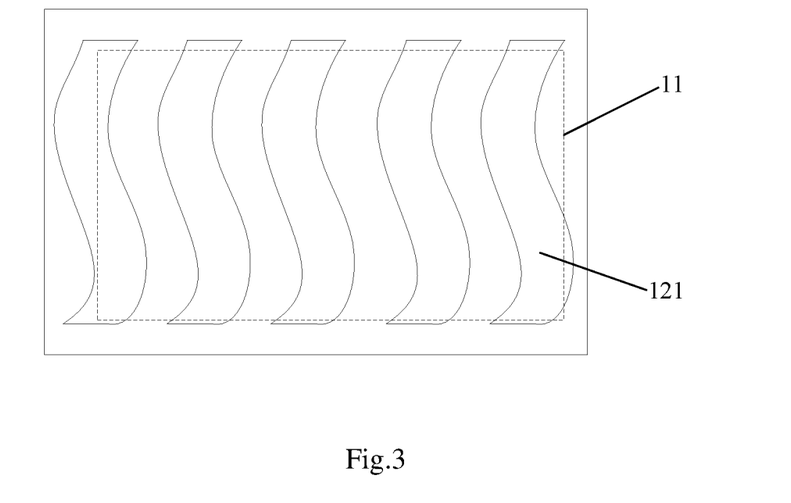
FIG. 3 is a plan view of a first film layer according to some embodiments of the present disclosure.
Figure 4:
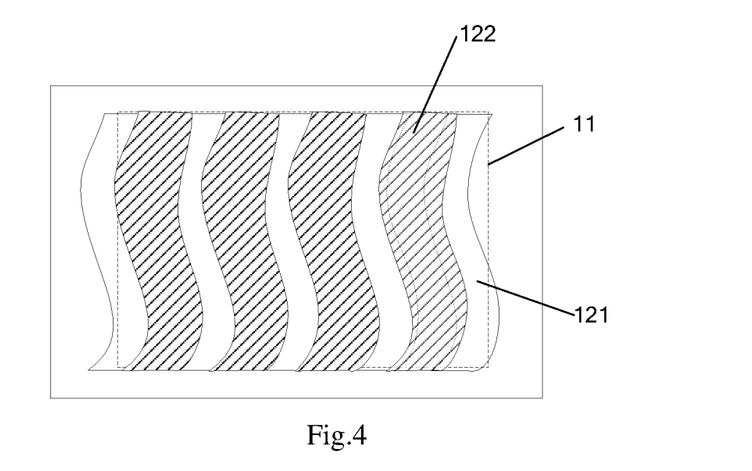
FIG. 4 is a plan view of a first film layer and a second film layer according to some embodiments of the present disclosure.

According to some embodiments of the present disclosure, as shown in FIG. 3, the first film layer 121 has curved bar-like patterns, i.e., the first film layer 121 includes a plurality of curved bar-like structures. The second film layer 121 also has curved bar-like patterns which are matched and complementary to the patterns of the first film layer 121. To be specific, the second film layer 122 also includes a plurality of curved bar-like structures which cover the gaps in the first film layer 121, as shown in FIG. 4. In addition, by the curved bar-like structures, an extending path of the stress performed on the film layer from different directions may be cut off, and the extension of the cracks may be blocked. In addition, the first and the second film layers are patterned by using mask plates to deposit film layers, and the mask plate corresponding to the curved bar-like structures is easy to be manufactured.

In addition, in order to cover the light-emitting component completely without exposed or easy-to-be exposed areas, the bar-like structures of the first film layer 121 and those of the second film layer 122 are to made to be overlapped as much as possible.

Figure 5:
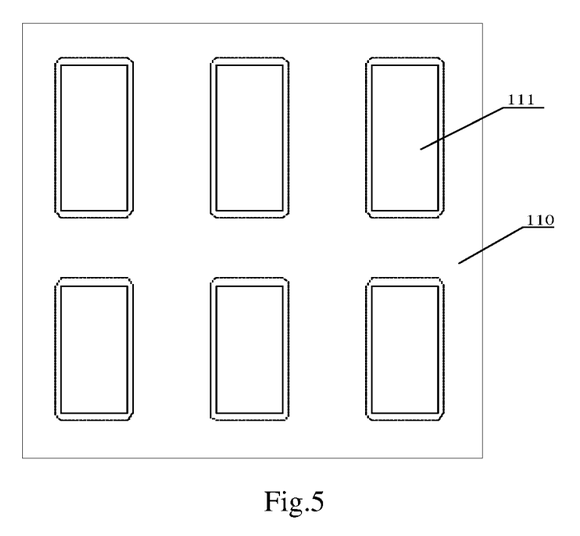
FIG. 5 is a plan view of a pixel-defining layer according to some embodiments of the present disclosure.

According to some embodiments of the present disclosure, the flexible display device further includes: a pixel-defining structure 110 in which luminescent material filling areas 111 are arranged, as shown in FIG. 5. The luminescent materials are filled into the luminescent material filling areas 111. There exists an overlapping area of the first film layer 121 and the second film layer 122, and the overlapping area corresponds to the pixel-defining structure 110.

Moisture and oxygen may enter into the overlapping area of the first film layer 121 and the second film layer 122 (especially when the flexible display device is bended), so when the overlapping area of the first and the second film layers are arranged above the pixel-defining structure 110, the pixel-defining structure 110 is made of materials which resist moisture and oxygen corrosion, thus, even though moisture and oxygen enter into the overlapping area, they may only exist above the pixel-defining structure 110 and do not affect the light-emitting component 11.

Figure 6:
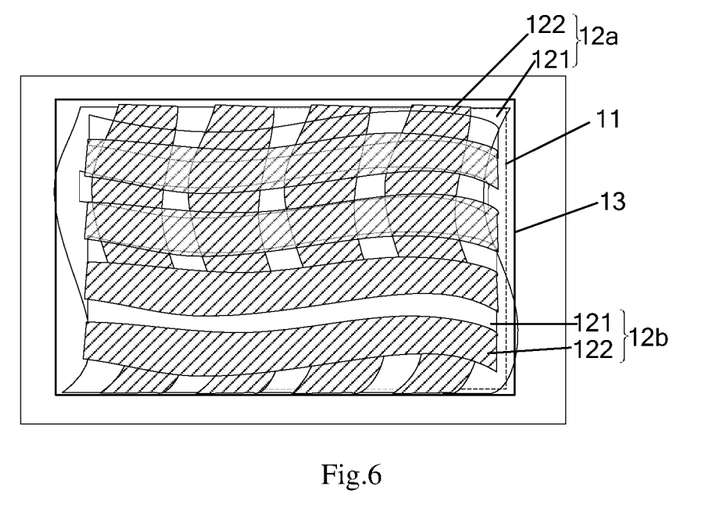
FIG. 6 is a plan view of a packaging structure of a flexible display device according to some embodiments of the present disclosure.

According to some embodiments of the present disclosure, the flexible display device further includes planarization layers 13. The planarization layers 13 and the packaging layers 12 are stacked alternately to package the light-emitting component 11 of the flexible display device. According to some embodiments of the present disclosure, there is a plurality of planarization layers 13 and a plurality of packaging layers 12 which are arranged alternately to form a multiple-layer stacked structure. The planarization layer 13 mainly performs planarization function and releases the stress, which is generally formed of organic materials. The moisture and oxygen blocking layer 12 mainly blocks moisture and oxygen, which is generally formed of inorganic materials. According to some embodiments of the present disclosure, the moisture and oxygen blocking layer 12 is formed of silicon nitride, silicon oxynitride, silicon carbonitride, aluminium oxide or titanium dioxide, and the first film layer 121 and the second film layer 122 may be made of the same or different materials as needed. In addition, moisture or oxygen may be brought in when manufacturing the planarization layers 13, so the moisture and oxygen blocking layer 12 is formed on the light-emitting component and then the planarization layer 13 is formed, after the thin film transistor and the light-emitting component are formed. Optionally, when the planarization layers 13 and the moisture and oxygen blocking layers 12 are stacked alternately, the moisture and oxygen blocking layer 12 may be arranged first. In other words, at least one moisture and oxygen blocking layer 12 is arranged between the planarization layer 13 and the light-emitting component 11.

Optionally, when the planarization layers 13 and the packaging layers 12 are stacked alternately, the bar-like patterns of the moisture and oxygen blocking layers 12a and 12b arranged on two sides of the planarization layer 13 are complementary to each other. The bar-like patterns of the moisture and oxygen blocking layer 12a are arranged along a first direction (e.g., laterally), and the bar-like patterns of the moisture and oxygen blocking layer 12b are arranged along a second direction (e.g., longitudinally) which is not parallel to the first direction, thereby preventing moisture and oxygen from entering into the overlapping area of the first and the second film layers of the moisture and oxygen blocking layer in a better manner.

According to some embodiments of the present disclosure, the moisture and oxygen blocking layer 12 is taken as the packaging layer, and the moisture and oxygen blocking layer 12 only includes the first film layer and the second film layer. In practical application, the moisture and oxygen blocking layer 12 is not limited to including the first film layer and the second film layer, and the moisture and oxygen blocking layer 12 may have more layers. The patterns, arrangement density of each film layer is subject to a bending radius of the display screen, and the thickness of each film layer may affect each other. Those skilled in the art may design or optimize an amount of the film layers, an interval between the film layers, a thickness of each film layer and patterns according to actual conditions.

Furthermore, the packaging film 14 which covers the light-emitting component 11 completely may further be formed on the stacked structure formed by arranging the planarization layers 13 and the moisture and oxygen blocking layers 12 alternately.

According to the flexible display device provided by some embodiments of the present disclosure, the planarization layers and the moisture and oxygen blocking layers are stacked alternately to package the light-emitting component. In addition, the moisture and oxygen blocking layers are patterned, and the patterns of different moisture and oxygen blocking layers are arranged staggerly. In one hand, the light-emitting component is covered completely, and moisture and oxygen is blocked. In another hand, by the patterning design, an extending path of the stress performed on the film layer may be cut off, an extension of the cracks may be blocked, and a probability of microcracks may be reduced when the flexible display device is bended, thereby the film packaging may be made to be bend-resistant.

Embodiment Two

A method for packaging a flexible display device is provided by some embodiments of the present disclosure, including a step of forming a packaging layer. The step of forming the packaging layer includes: forming a patterned first film layer; and forming a second film layer at least covering patterned gaps in the first film layer.

If the patterning is performed by etching, the film layer of the light-emitting component may be broken no matter whether the film layer is etched by dry etching or wet etching, and moisture may be brought in if the film layer is etched by wet etching. Thus, when forming the moisture and oxygen blocking layer, the first film layer nay be patterned with a mask plate, and the second film layer may be patterned or not patterned, as long as the second film layer may at least covers the patterned gaps in the first film layer, so as to cover the light-emitting component completely and then protect the same. If the second film layer is also patterned, the step of forming the first film layer or second film layer may include: forming the patterned first film layer or the patterned second film layer by a vapor deposition method. The vapor deposition may be performed with mask plates, so as to form the patterned first film layer or the second film layer.

In practical implementation, thicknesses of the first film layer and the second film layer and the patterns thereof may be arranged as needed (e.g., according to the bend-resistant performance), and that is not limited herein.

According to the method for packaging a flexible display device provided by some embodiments of the present disclosure, the flexible display device at least includes one packaging layer provided by some embodiments of the present disclosure. In one hand, the light-emitting component is covered completely, and moisture and oxygen is blocked. In another hand, the first film layer of the packaging layer is patterned, by which, when the flexible display device is bended, crimped or even folded, an extending path of the stress performed on the film layer may be cut off, an extension of the cracks may be blocked, and a probability of microcracks may be reduced when the flexible display device is bended, thereby the film packaging may be made to be bend-resistant.

Optionally, the first and the second film layers formed in the steps hereinabove may extend outward, thereby lateral sides of the light-emitting component at a very edge of the flexible display device may be covered by the packaging layer, so as to block moisture and oxygen.

Optionally, before the flexible display device is packaged, the method further includes: forming a pixel-defining structure 110 with luminescent material filling areas 111; filling luminescent materials into the luminescent material filling areas 111; and forming an upper electrode. An overlapping area of the first film layer 121 and the second film layer 122 formed in the process of packaging corresponds to an area of the pixel-defining structure, such that the light-emitting component may not be influenced even moisture and oxygen enters into the overlapping area.

Optionally, the method further includes a step of forming planarization layers. The steps of forming the planarization layers and the steps of forming the packaging layers are performed alternately. Optionally, after the light-emitting component is formed, the packaging layer is first formed, and then the planarization layers and the packaging layers are formed alternately.

For example, the packaging layer is the moisture and oxygen blocking layer 12, the planarization layers and the packaging layers 12 are formed alternately according to the method hereinabove, so as to form a stacked structure where the planarization layers 13 and the packaging layers 12 are arranged alternately to package the light-emitting component 11 of the flexible display device. Moisture or oxygen may be brought in when manufacturing the planarization layers 13, so the moisture and oxygen blocking layer 12 is formed right after the thin film transistor and the light-emitting component are formed.

In order to make those skilled in the art to understand the packaging method provided by some embodiments of the present disclosure better, the technical solution provided by some embodiments of the present disclosure may be described in detail in conjunction with the embodiments by taking the moisture and oxygen blocking layer 12 for example.

Figure 7:
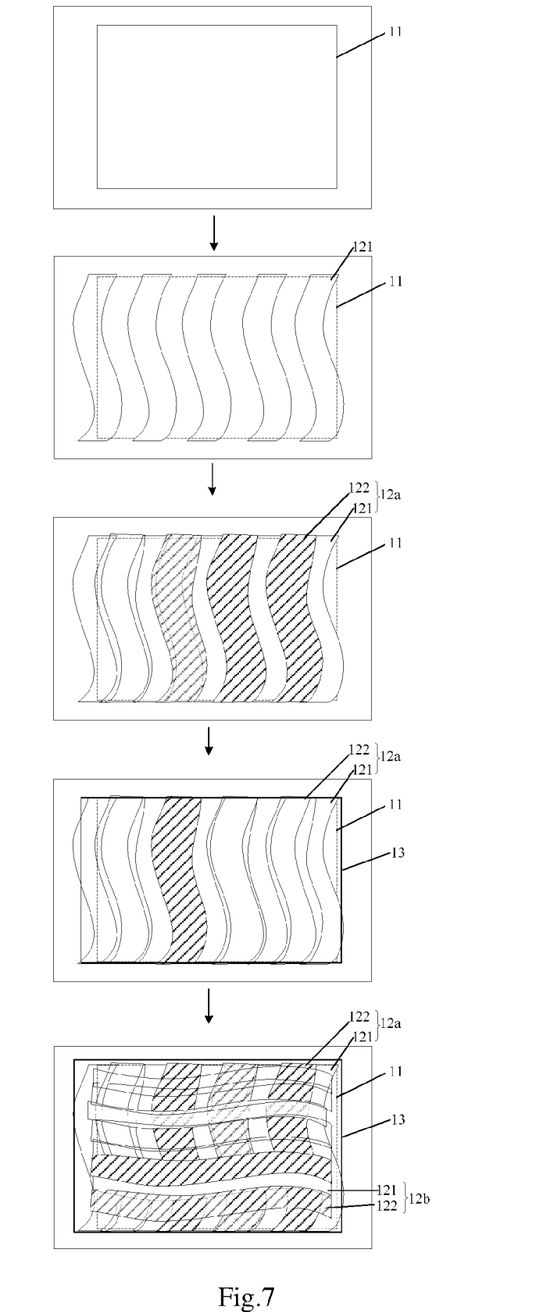
FIG. 7 is a flow chart of a process of packaging a flexible display device according to some embodiments of the present disclosure.
Figure 8:
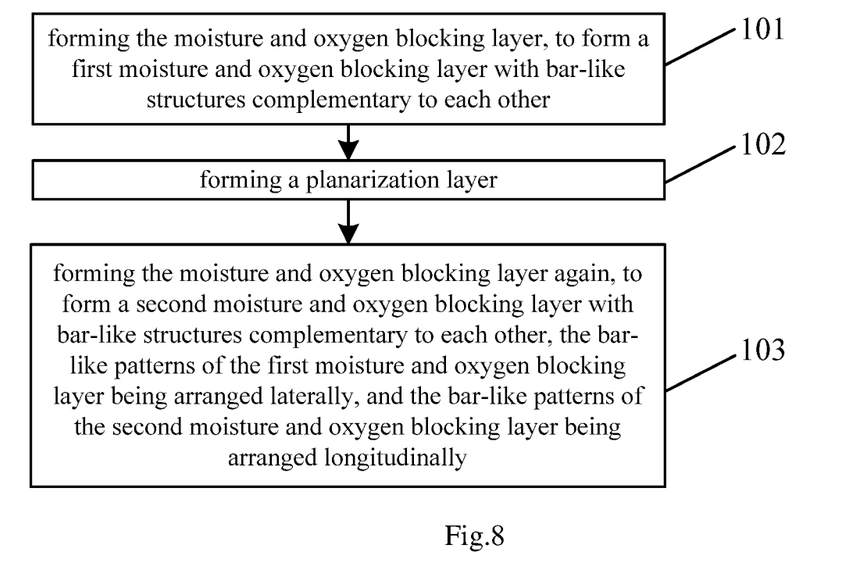
FIG. 8 is a flow chart of a method of packaging a flexible display device according to some embodiments of the present disclosure.

According to the packaging method provided by some embodiments of the present disclosure, the steps of forming planarization layers and the steps of forming the moisture and oxygen blocking layers are performed alternately. As shown in FIG. 7 and FIG. 8, the method includes:

Step 101: forming the moisture and oxygen blocking layer, to form a first moisture and oxygen blocking layer 12a with bar-like structures complementary to each other, i.e., the formed first packaging layer is the first moisture and oxygen blocking layer 12a which includes bar-like structures complementary to each other.

Figure 9:
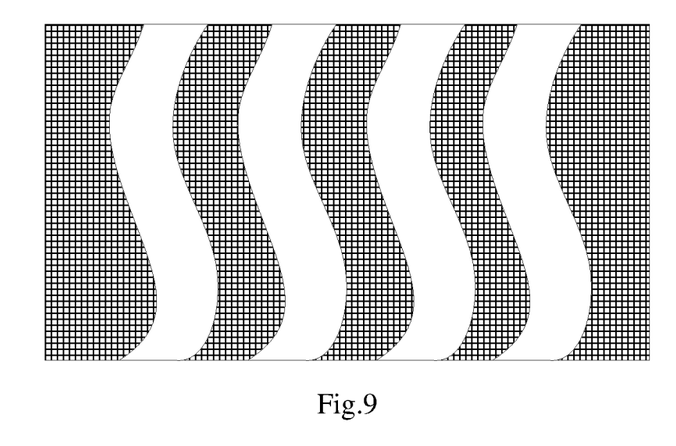
FIG. 9 is a schematic view of a mask plate 1-1 according to some embodiments of the present disclosure.
Figure 10:
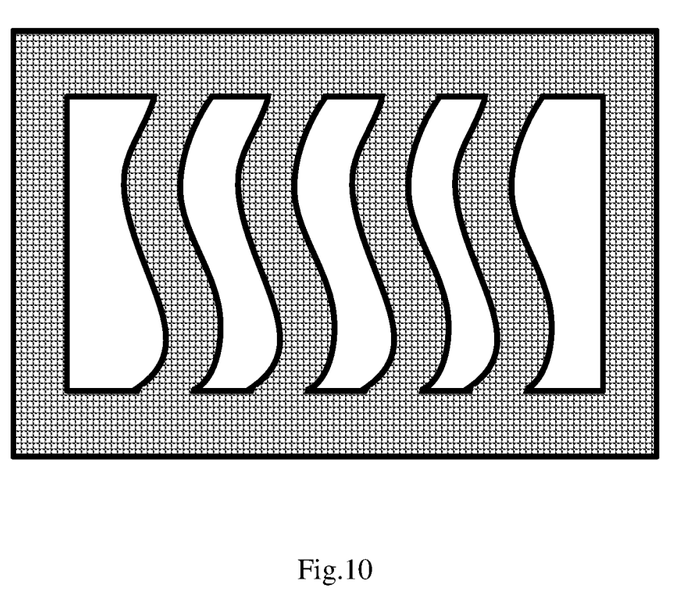
FIG. 10 is a schematic view of a mask plate 1-2 according to some embodiments of the present disclosure.

In Step 101, the first moisture and oxygen blocking layer is formed on a surface of an organic light-emitting layer, and this step includes: aligning in a vacuum environment, and depositing a first inorganic material layer above the light-emitting component by a mask plate 1-1 (as shown in FIG. 9) having curved bar-like patterns, with the formed first inorganic material layer having curved bar-like patterns; and depositing a second inorganic material layer by a mask plate 1-2 (as shown in FIG. 10) having curved bar-like patterns, with the formed second inorganic material layer also having curved bar-like patterns, and the curved bar-like patterns of the first and the second inorganic material layers being complementary to each other longitudinally. An area covered by the curved patterns of the second inorganic material layer is slightly larger than curved gaps between the curved patterns of the first inorganic material layer. The first moisture and oxygen blocking layer 12a is formed by jointing the first inorganic material layer (the first film layer 121) and the second inorganic material layer (the second film layer 122) together. FIG. 9 and FIG. 10 are the schematic views of the mask plate 1-1 and the mask plate 1-2, respectively.

Step 102: forming a planarization layer 13. The planarization layer 13 is manufactured in this step. Optionally, a method for manufacturing the planarization layer includes: depositing organic layer materials by a mask having an opening at a display area of the flexible display device, or, coating organic layer materials by a screen printing/dispensing device.

Step 103: forming the moisture and oxygen blocking layer again, to form a second moisture and oxygen blocking layer 12b with bar-like structures complementary to each other, the bar-like patterns of the first moisture and oxygen blocking layer 12a being arranged laterally, and the bar-like patterns of the second moisture and oxygen blocking layer 12b being arranged longitudinally.

That is, a second packaging layer is formed in this step. The second packaging layer includes bar-like structures which are complementary to each other. The bar-like structures of the second packaging layer and the bar-like structures of the first packaging layer are crossed. Step 103 may refer to Step 101, the difference lies in that the stripes of the mask plate used in forming the second packaging layer are arranged along a direction different from that of the mask plate used in Step 101. The second moisture and oxygen blocking layers including curved patterns are formed by both of the mask plates used in the two steps, the only difference lies in that the stripes extend along different directions of a panel.

It should be noted that, according to some embodiments of the present disclosure, the planarization layer is formed on the moisture and oxygen blocking layer, and then another moisture and oxygen blocking layer is formed on the planarization layer to form a three-layer structure. In practical application, the amounts of the stacked planarization layers and the moisture and oxygen blocking layers are not limited.

According to some embodiments of the present disclosure, the moisture and oxygen blocking layer for packaging is patterned to form curved patterns and the curved patterns of different moisture and oxygen blocking layers are staggered arranged, thereby the packaging film layer of the light-emitting component may be bend-resistant. In addition, a corrosion path of moisture and oxygen is prescribed by arranging curved patterns, an area prone-to-be corroded corresponds to corrosion-resistant pixel-defining structure material, thereby the moisture and oxygen blocking performance of the packaging layer may be improved.

The flexible display device provided by some embodiments of the present disclosure may be a product or a component with display function, such as OLED panel, electronic paper, cell phone, tablet PC, television, displayer, laptop, digital photo frame and navigator.

The technical features of the embodiments may be used in any combination thereof under the premise of no confliction.

In order to describe the present disclosure more clearly, such words as "first" and "second" used in the present disclosure is to differential similar technical features, rather than to limit the amount, which only represent a preferable embodiment. Alternations and improvements made by those skilled in the art made by those skilled in the art based on the present disclosure may also fall into the scope of the present disclosure.

The embodiments of the present disclosure are described one by one, and similar parts of the embodiments may refer to each other. The method embodiment is similar to the product embodiment, so the description thereof is simple, which may refer to the product embodiment for the related part.

The above are merely the preferred embodiments of the present disclosure. A person skilled in the art may make further modifications and improvements based on the present disclosure, and these modifications and improvements shall also fall within the scope of the present disclosure.

What is claimed is:

1. A flexible display device, comprising a light-emitting component and a packaging layer for packaging the light-emitting component, which packaging layer resists breaking when the flexible display device is bended, crimped, or folded; wherein the packaging layer comprises:
   a patterned first film layer with patterned gaps; and
   a second film layer, at least covering the patterned gaps in the first film layer,
   wherein the packaging layer is a moisture and oxygen blocking layer, the flexible display device further comprises a pixel-defining structure defining luminescent material filling areas, there is an overlapping area of the first film layer and the second film layer, and the overlapping area corresponds to the pixel-defining structure.

2. The flexible display device according to claim 1, wherein the first film layer and the second film layer are arranged above or below the light-emitting component, and edges of the first film layer and the second film layer extend outward to cover lateral sides of the light-emitting component at a very edge of the flexible display device.

3. The flexible display device according to claim 1, wherein the first film layer comprises a plurality of curved bar-like structures.

4. The flexible display device according to claim 3, wherein the second film layer comprises a plurality of curved bar-like structures, and the bar-like structures of the second film layer are complementary to the bar-like structures of the first film layer.

5. The flexible display device according to claim 1, further comprising planarization layers; wherein the planarization layers and the packaging layers are stacked alternately to package the light-emitting component of the flexible display device.

6. The flexible display device according to claim 5, wherein at least one of the packaging layers is arranged between the planarization layer and the light-emitting component.

7. The flexible display device according to claim 5, wherein two packaging layers arranged at two sides of the planarization layers both have bar-like patterns; wherein the bar-like patterns of one of the two packaging layers are arranged along a first direction, and the bar-like patterns of the other one of the two packaging layers are arranged along a second direction which is not parallel to the first direction.

8. The flexible display device according to claim 1, wherein the patterned gaps in a frequently-bended portion of the first film layer are arranged at a first patterned gap density, and the patterned gaps in a portion of the first film layer except the frequently-bended portion of the first film layer are arranged at a second patterned gap density; the first patterned gap density is larger than the second patterned gap density.

9. The flexible display device according to claim 1, wherein the first film layer and the second film layer are made of different inorganic materials.

10. A method for packaging a flexible display device, comprising a step of forming a packaging layer that resists breaking when the flexible display device is bended, crimped, or folded; wherein the step of forming the packaging layer comprises:

forming a patterned first film layer with patterned gaps; and forming a second film layer at least covering the patterned gaps in the first film layer, wherein the packaging layer is a moisture and oxygen blocking layer, the flexible display device further comprises a pixel-defining structure defining luminescent material filling areas, there is an overlapping area of the first film layer and the second film layer, and the overlapping area corresponds to the pixel-defining structure.

11. The method according to claim 10, wherein the second film layer is patterned; and the patterned first film layer or the patterned second film layer is formed by a vapor deposition method.

12. The method according to claim 10, further comprising a step of forming a planarization layer; wherein the step of forming the planarization layer and the step of forming the packaging layer are performed alternately.

13. The method according to claim 12, wherein, after a light-emitting component is manufactured, the packaging layer is first formed.

14. The method according to claim 12, wherein the step of forming the planarization layer and the step of forming the packaging layer being performed alternately comprises:

forming a first packaging layer with bar-like structures which are complementary to each other;

forming one planarization layer; and forming a second packaging layer with bar-like structures which are complementary to each other;

wherein the bar-like structures in the second packaging layer and the bar-like structures in the first packaging layer cross each other.

15. The method according to claim 12, the step of forming the planarization layer comprises:

depositing the planarization layer onto a display area of the flexible display device by a vapor deposition method, or coating the planarization layer by a screen printing machine or a spraying device.

16. A flexible display device, made by the method according to claim 10 and comprising a light-emitting component and a packaging layer for packaging the light-emitting component, which packaging layer resists breaking when the flexible display device is bended, crimped, or folded; wherein the packaging layer comprises:

a patterned first film layer with patterned gaps; and a second film layer, at least covering the patterned gaps in the first film layer.

17. A flexible display device, comprising a light-emitting component and a packaging layer for packaging the light-emitting component, which packaging layer resists breaking when the flexible display device is bended, crimped, or folded; wherein the packaging layer comprises:

a patterned first film layer with patterned gaps; and a second film layer, at least covering the patterned gaps in the first film layer, wherein the packaging layer is a moisture and oxygen blocking layer, the flexible display device further comprises planarization layers, the planarization layers and the packaging layers are stacked alternately to package the light-emitting component of the flexible display device, two packaging layers arranged at two sides of the planarization layers both have bar-like patterns, the bar-like patterns of one of the two packaging layers are arranged along a first direction, and the bar-like patterns of the other one of the two packaging layers are arranged along a second direction which is not parallel to the first direction.

18. The flexible display device according to claim 17, wherein the first film layer and the second film layer are arranged above or below the light-emitting component, and edges of the first film layer and the second film layer extend outward to cover lateral sides of the light-emitting component at a very edge of the flexible display device.

19. The flexible display device according to claim 17, wherein the first film layer comprises a plurality of curved bar-like structures.

20. The flexible display device according to claim 19, wherein the second film layer comprises a plurality of curved bar-like structures, and the bar-like structures of the second film layer are complementary to the bar-like structures of the first film layer.

* * * * *